United States Patent
Mellette et al.

(10) Patent No.: US 11,632,330 B2
(45) Date of Patent: Apr. 18, 2023

(54) OPTIMIZING CONNECTIVITY IN RECONFIGURABLE NETWORKS

(71) Applicant: The Regents of the University of California, Oakland, CA (US)

(72) Inventors: William Mellette, San Diego, CA (US); Alex Snoeren, San Diego, CA (US); George Porter, San Diego, CA (US); George Papen, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 23 days.

(21) Appl. No.: 16/965,979

(22) PCT Filed: Jan. 31, 2019

(86) PCT No.: PCT/US2019/016170
§ 371 (c)(1),
(2) Date: Jul. 29, 2020

(87) PCT Pub. No.: WO2019/152725
PCT Pub. Date: Aug. 8, 2019

(65) Prior Publication Data
US 2021/0044531 A1    Feb. 11, 2021

Related U.S. Application Data

(60) Provisional application No. 62/624,331, filed on Jan. 31, 2018.

(51) Int. Cl.
*H04L 12/28* (2006.01)
*H04L 47/24* (2022.01)
(Continued)

(52) U.S. Cl.
CPC .............. *H04L 47/24* (2013.01); *H04L 45/02* (2013.01); *H04Q 3/0004* (2013.01); *H04Q 3/0091* (2013.01)

(58) Field of Classification Search
CPC ............ H04J 3/0629; H04J 2203/0007; H04L 12/423; H04L 47/24; H04L 45/02;
(Continued)

(56) References Cited

U.S. PATENT DOCUMENTS 5,377,182 A    12/1994 Monacos
5,469,164 A    11/1995 Kemp
(Continued)

OTHER PUBLICATIONS

Mellette et al., Physical Layer Driven Optical Switching for Data Center Networks, Theses and Dissertations, UC San Diego, downloadable at https://escholarship.org/uc/item/8w39x9bd, 155 pages, 2016.*

(Continued)

*Primary Examiner* — Frank Duong
(74) *Attorney, Agent, or Firm* — Mintz Levin Cohn Ferris Glovsky and Popeo, P.C.

(57) ABSTRACT

A method may include determining whether the topology of a network includes a direct path between a first endpoint and a second endpoint in the network. A direct path may be used to send a first type of traffic from the first endpoint to the second endpoint whereas any currently available path may be used to send a second type of traffic from the first endpoint to the second endpoint. If the topology of the network does not include a direct path, the first type of traffic may be buffered at the first endpoint until the topology of the network is reconfigured to include the direct path. The topology of the network may be reconfigured when at least one switch in the network reconfigures, for example, by switching from one interconnection to another interconnection pattern. Related systems and articles of manufacture are also provided.

18 Claims, 8 Drawing Sheets

(51) Int. Cl.
*H04L 45/02* (2022.01)
*H04Q 3/00* (2006.01)

(58) Field of Classification Search
CPC ..... H04L 49/101; H04L 49/106; H04L 49/15;
H04L 49/254; H04L 49/30; H04L
2012/6405; H04M 9/022; H04Q 3/0004;
H04Q 3/0091; H04Q 11/0407; H04Q
11/06; H04Q 2213/13003; H03K
19/17744
See application file for complete search history.

(56) References Cited

U.S. PATENT DOCUMENTS

| | | | | |
|---|---|---|---|---|
| 9,170,971 | B2* | 10/2015 | Goss | H04L 49/10 |
| 9,553,788 | B1* | 1/2017 | Callan | H04L 43/10 |
| 9,929,960 | B1* | 3/2018 | Abts | H04L 43/0888 |
| 2009/0161684 | A1 | 6/2009 | Voruganti et al. | |
| 2015/0200803 | A1 | 7/2015 | Kashyap et al. | |
| 2016/0034625 | A1 | 2/2016 | Wang et al. | |
| 2016/0248631 | A1* | 8/2016 | Duchesneau | H01B 3/24 |
| 2021/0141158 | A1* | 5/2021 | Porter | G02B 6/262 |

OTHER PUBLICATIONS

Mellette et al., RotorNet: A Scalable, Low-complexity, Optical Datacenter Network, ACM, 14 pages, Aug. 23, 2017.*
Mellette et al., A scalable, partially configurable optical switch for data center networks, Journal of Lightwave Technology, 9 pages, Jan. 15, 2017.*
Mellette et al., 61 Port 1×6 Selector Switch for Data Center Networks, OFC 2016 © OSA 2016, 3 pages, 2016.*
Papen, Optical Components for Datacenters, OFC 2017 © OSA 2017, 53 pages, 2017.*
Chen, L. et al., "Enabling Wide-Spread Communications on Optical Fabric with MegaSwitch," (NSDI '17).
Farrington, N. et al., "Helios: A Hybrid Electrical/Optical Switch Architecture for Modular Data Centers" (SIGCOMM '10).
Ghobadi, M. et al., "ProjecToR: Agile Reconfigurable Data Center Interconnect," (SIGCOMM '16).
Mellette, W. et al., RotorNet: A Scalable, Low-complexity, Optical Datacenter Network,: (SIGCOMM '17).

* cited by examiner

OPTIMIZING CONNECTIVITY IN RECONFIGURABLE NETWORKS

RELATED APPLICATION

This application is a national stage entry of Patent Cooperation Treaty Application No. PCT/US2019/016170 filed Jan. 31, 2019, entitled "OPTIMIZING CONNECTIVITY IN RECONFIGURABLE NETWORKS," which claims priority to U.S. Provisional Patent Application No. 62/624,331 filed on Jan. 31, 2018, entitled "LOW LATENCY CONNECTIVITY IN RECONFIGURABLE NETWORKS," the disclosures of which are incorporated herein by reference in their entirety.

STATEMENT AS TO FEDERALLY SPONSORED RESEARCH

This invention was made with Government support under DE-AR0000845 awarded by the Department of Energy and under CNS-1553490 awarded by the National Science Foundation. The Government has certain rights in the invention.

TECHNICAL FIELD

The subject matter disclosed herein relates generally to computing networks and more specifically to the optimization of connectivity in a network having a reconfigurable topology.

BACKGROUND

A circuit switched network may rely on crossbar switches to interconnect the endpoints of the circuit switched network. A crossbar switch may include a matrix of individual switching elements. By toggling one or more of the switching elements, a dedicated connection may be established between endpoints coupled with any pair of input port and output port in the crossbar switch. Nevertheless, achieving full connectivity between every endpoint in the circuit switched network may be require complex crossbar switches having numerous switching elements.

SUMMARY

Systems, methods, and articles of manufacture, including computer program products, are provided for routing traffic in a network having a reconfigurable topology. In one aspect, there is provided a system that includes at least one data processor and at least one memory. The at least one memory may store instructions that cause operations when executed by the at least one data processor. The operations may include: in response to determining that the data packet comprises a first type of traffic, determining whether a topology of a network includes a direct path between a first endpoint in the network and a second endpoint in the network, the network including a plurality of endpoints interconnected by a plurality of switches, the topology of the network at any one time including a direct path between at least a portion of the plurality of endpoints in the network, and the direct path interconnecting the first endpoint and the second endpoint through a single switch; in response to determining that the topology of the network includes an indirect path but not the direct path between the first endpoint and the second endpoint, buffering, at the first endpoint, a data packet until the topology of the network is reconfigured to include the direct path between the first endpoint and the second endpoint, the data packet being buffered based at least on the data packet being the first type of traffic, and the topology of the network being reconfigured by a reconfiguration of at least one of the plurality of switches; and sending, via the direct path, the data packet from the first endpoint to the second endpoint.

In some variations, one or more features disclosed herein including the following features can optionally be included in any feasible combination. In response to the data packet being classified as a second type of traffic, the data packet may be sent to the second endpoint using a currently available path included in the topology of the network. The currently available path may be the indirect path. The indirect path may interconnect the first endpoint and the second endpoint through more than one of the plurality of switches. The indirect path may further route the data packet through at least a third endpoint in the network before the data packet is delivered to the second endpoint.

In some variations, the plurality of switches may include a plurality of crossbar switches. Each of the plurality of crossbar switches may include a matrix of switching elements. Toggling one or more switching elements may form a dedicated connection between at least one pair of input port and output port in a corresponding crossbar switch.

In some variations, the plurality of switches may include a plurality of selector switches configured to switch between different interconnection patterns. The topology of the network may be determined by an interconnection pattern at each of the plurality of selector switches. The topology of the network may be reconfigured by at least a first selector switch switching from a first interconnection pattern to a second interconnection pattern. The first interconnection pattern may interconnect the first endpoint and the second endpoint indirectly through a third interconnection pattern at a second selector switch. The second interconnection pattern may interconnect the first endpoint and the second endpoint directly. The data packet may be buffered at the first endpoint until the first selector switch switches to the second interconnection pattern.

In some variations, the first selector switch may include a plurality of input ports and a plurality of output ports. The first selector switch may be configured to switch between a subset of interconnection patterns that includes the first interconnection pattern and the second interconnection pattern. The subset of interconnection patterns may include some but not all of a plurality of possible interconnection patterns between the plurality of input ports and the plurality of output ports in the first selector switch.

In some variations, the topology of the network may be further reconfigured by a second selector switch switching from a third interconnection pattern to a fourth interconnection pattern. The first selector switch and the second selector switch may be configured to switch interconnection patterns at different times. The first selector switch may be configured to switch interconnection patterns at least a threshold quantity of time before or after the second selector switch is configured to switch interconnection patterns. The threshold quantity of time may be determined based at least on a maximum end-to-end delay associated with the network. The threshold quantity of time may be determined based on a reconfiguration delay associated with the network.

In some variations, the first type of traffic may include traffic exceeding a size threshold and the second type of traffic may include traffic not exceeding the size threshold. The first type of traffic may include traffic exceeding a latency threshold and the second type of traffic may include traffic not exceeding the latency threshold. The data packet may be classified as the first type of traffic or the second type of traffic based at least on a current traffic conditions in the network. The data packet may be classified as the first type of traffic or the second type of traffic based at least on a computer program generating the data packet.

In some variations, every reconfiguration of the topology of the network may include at least one path between the first endpoint and the second endpoint. At least one reconfiguration of the topology of the network may include the direct path between the first endpoint and the second endpoint.

In another aspect, there is provided a method for routing traffic in a network having a reconfigurable topology. The method may include: in response to determining that the data packet comprises a first type of traffic, determining whether a topology of a network includes a direct path between a first endpoint in the network and a second endpoint in the network, the network including a plurality of endpoints interconnected by a plurality of switches, the topology of the network at any one time including a direct path between at least a portion of the plurality of endpoints in the network, and the direct path interconnecting the first endpoint and the second endpoint through a single switch; in response to determining that the topology of the network includes an indirect path but not the direct path between the first endpoint and the second endpoint, buffering, at the first endpoint, a data packet until the topology of the network is reconfigured to include the direct path between the first endpoint and the second endpoint, the data packet being buffered based at least on the data packet being the first type of traffic, and the topology of the network being reconfigured by a reconfiguration of at least one of the plurality of switches; and sending, via the direct path, the data packet from the first endpoint to the second endpoint.

In some variations, one or more features disclosed herein including the following features can optionally be included in any feasible combination. The method may further include in response to the data packet being classified as a second type of traffic, sending the data packet to the second endpoint using a currently available path included in the topology of the network. The currently available path may be the indirect path. The indirect path may interconnect the first endpoint and the second endpoint through more than one of the plurality of switches. The indirect path may further route the data packet through at least a third endpoint in the network before the data packet is delivered to the second endpoint.

In some variations, the plurality of switches may include a plurality of crossbar switches. Each of the plurality of crossbar switches may include a matrix of switching elements. Toggling one or more switching elements may form a dedicated connection between at least one pair of input port and output port in a corresponding crossbar switch.

In some variations, the plurality of switches may include a plurality of selector switches configured to switch between different interconnection patterns. The topology of the network may be determined by an interconnection pattern at each of the plurality of selector switches. The topology of the network may be reconfigured by at least a first selector switch switching from a first interconnection pattern to a second interconnection pattern. The first interconnection pattern may interconnect the first endpoint and the second endpoint indirectly through a third interconnection pattern at a second selector switch. The second interconnection pattern may interconnect the first endpoint and the second endpoint directly. The data packet may be buffered at the first endpoint until the first selector switch switches to the second interconnection pattern.

In some variations, the first selector switch may include a plurality of input ports and a plurality of output ports. The first selector switch may be configured to switch between a subset of interconnection patterns that includes the first interconnection pattern and the second interconnection pattern. The subset of interconnection patterns may include some but not all of a plurality of possible interconnection patterns between the plurality of input ports and the plurality of output ports in the first selector switch.

In some variations, the topology of the network may be further reconfigured by a second selector switch switching from a third interconnection pattern to a fourth interconnection pattern. The first selector switch and the second selector switch may be configured to switch interconnection patterns at different times. The first selector switch may be configured to switch interconnection patterns at least a threshold quantity of time before or after the second selector switch is configured to switch interconnection patterns. The threshold quantity of time may be determined based at least on a maximum end-to-end delay associated with the network and/or a reconfiguration delay associated with the network.

In some variations, every reconfiguration of the topology of the network may include at least one path between the first endpoint and the second endpoint. At least one reconfiguration of the topology of the network may include the direct path between the first endpoint and the second endpoint.

In some variations, the first type of traffic may include traffic exceeding a size threshold and the second type of traffic may include traffic not exceeding the size threshold. The first type of traffic may include traffic exceeding a latency threshold and the second type of traffic may include traffic not exceeding the latency threshold. The data packet may be classified as the first type of traffic or the second type of traffic based on a current traffic conditions in the network and/or a computer program generating the data packet.

In another aspect, there is provided a computer program product for routing traffic in a network having a reconfigurable topology. The computer program product may include a non-transitory computer readable medium. The non-transitory computer readable medium may store instructions that cause operations when executed by at least one data processor. The operations may include: in response to determining that the data packet comprises a first type of traffic, determining whether a topology of a network includes a direct path between a first endpoint in the network and a second endpoint in the network, the network including a plurality of endpoints interconnected by a plurality of switches, the topology of the network at any one time including a direct path between at least a portion of the plurality of endpoints in the network, and the direct path interconnecting the first endpoint and the second endpoint through a single switch; in response to determining that the topology of the network includes an indirect path but not the direct path between the first endpoint and the second endpoint, buffering, at the first endpoint, a data packet until the topology of the network is reconfigured to include the direct path between the first endpoint and the second endpoint, the data packet being buffered based at least on the data packet being the first type of traffic, and the topology of the network being reconfigured by a reconfiguration of at least one of the plurality of switches; and sending, via the direct path, the data packet from the first endpoint to the second endpoint.

In another aspect, there is provided an apparatus for routing traffic in a network having a reconfigurable topology. The apparatus may include: means for determining, in response to determining that a data packet comprises a first type of traffic, whether a topology of a network includes a direct path between a first endpoint in the network and a second endpoint in the network, the network including a plurality of endpoints interconnected by a plurality of switches, the topology of the network at any one time including a direct path between at least a portion of the plurality of endpoints in the network, and the direct path interconnecting the first endpoint and the second endpoint through a single switch; means for buffering at the first endpoint, in response to determining that the topology of the network includes an indirect path but not the direct path between the first endpoint and the second endpoint, the data packet until the topology of the network is reconfigured to include the direct path between the first endpoint and the second endpoint, the data packet being buffered based at least on the data packet being the first type of traffic, and the topology of the network being reconfigured by a reconfiguration of at least one of the plurality of switches; and means for sending, via the direct path, the data packet from the first endpoint to the second endpoint.

Systems, methods, and articles of manufacture, including computer program products, are provided for reconfiguring the topology of a network. In one aspect, there is provided a system that includes at least one data processor and at least one memory. The at least one memory may store instructions that cause operations when executed by the at least one data processor. The operations may include: performing a first reconfiguration of a topology of a network by at least switching, at a first time, interconnection patterns at a first selector switch in the network; and performing a second reconfiguration of the topology of the network by at least switching, at a second time, interconnection patterns at a second selector switch in the network, the network including a plurality of endpoints interconnected directly or indirectly by the interconnection patterns at the first selector switch and/or the second selector switch.

In some variations, one or more features disclosed herein including the following features can optionally be included in any feasible combination. The first selector switch may be configured to switch interconnection patterns at least a threshold quantity of time before or after the second selector switch is configured to switch interconnection patterns. The threshold quantity of time may be determined based at least on a maximum end-to-end delay associated with the network and/or a reconfiguration delay associated with the network.

In some variations, every reconfiguration of the topology of the network may include at least one path between every one of the plurality of endpoints in the network. At least one reconfiguration of the topology of the network may include a direct path every one of the plurality of endpoints in the network.

In another aspect, there is provided a method for reconfiguring the topology of a network. The method may include: performing a first reconfiguration of a topology of a network by at least switching, at a first time, interconnection patterns at a first selector switch in the network; and performing a second reconfiguration of the topology of the network by at least switching, at a second time, interconnection patterns at a second selector switch in the network, the network including a plurality of endpoints interconnected directly or indirectly by the interconnection patterns at the first selector switch and/or the second selector switch.

In some variations, one or more features disclosed herein including the following features can optionally be included in any feasible combination. The first selector switch may be configured to switch interconnection patterns at least a threshold quantity of time before or after the second selector switch is configured to switch interconnection patterns. The threshold quantity of time may be determined based at least on a maximum end-to-end delay associated with the network and/or a reconfiguration delay associated with the network.

In some variations, every reconfiguration of the topology of the network may include at least one path between every one of the plurality of endpoints in the network. At least one reconfiguration of the topology of the network may include a direct path every one of the plurality of endpoints in the network.

In another aspect, there is provided a computer program product for reconfiguring the topology of a network. The computer program product may include a non-transitory computer readable medium. The non-transitory computer readable medium may store instructions that cause operations when executed by at least one data processor. The operations may include: performing a first reconfiguration of a topology of a network by at least switching, at a first time, interconnection patterns at a first selector switch in the network; and performing a second reconfiguration of the topology of the network by at least switching, at a second time, interconnection patterns at a second selector switch in the network, the network including a plurality of endpoints interconnected directly or indirectly by the interconnection patterns at the first selector switch and/or the second selector switch.

In another aspect, there is provided an apparatus for reconfiguring the topology of a network. The apparatus may include: means for performing a first reconfiguration of a topology of a network by at least switching, at a first time, interconnection patterns at a first selector switch in the network; and means for performing a second reconfiguration of the topology of the network by at least switching, at a second time, interconnection patterns at a second selector switch in the network, the network including a plurality of endpoints interconnected directly or indirectly by the interconnection patterns at the first selector switch and/or the second selector switch.

Implementations of the current subject matter may include methods consistent with the descriptions provided herein as well as articles that comprise a tangibly embodied machine-readable medium operable to cause one or more machines (e.g., computers, etc.) to result in operations implementing one or more of the described features. Similarly, computer systems are also described that may include one or more processors and one or more memories coupled to the one or more processors. A memory, which can include a non-transitory computer-readable or machine-readable storage medium, may include, encode, store, or the like one or more programs that cause one or more processors to perform one or more of the operations described herein. Computer implemented methods consistent with one or more implementations of the current subject matter can be implemented by one or more data processors residing in a single computing system or multiple computing systems. Such multiple computing systems can be connected and can exchange data and/or commands or other instructions or the like via one or more connections, including, for example, to a connection over a network (e.g. the Internet, a wireless wide area network, a local area network, a wide area network, a wired network, or the like), via a direct connection between one or more of the multiple computing systems, etc.

The details of one or more variations of the subject matter described herein are set forth in the accompanying drawings and the description below. Other features and advantages of the subject matter described herein will be apparent from the description and drawings, and from the claims. While certain features of the currently disclosed subject matter are described for illustrative purposes in relation to connectivity in a network having a reconfigurable topology, it should be readily understood that such features are not intended to be limiting. The claims that follow this disclosure are intended to define the scope of the protected subject matter.

BRIEF DESCRIPTION OF THE DRAWINGS

The accompanying drawings, which are incorporated in and constitute a part of this specification, show certain aspects of the subject matter disclosed herein and, together with the description, help explain some of the principles associated with the subject matter disclosed herein. In the drawings.

When practical, similar reference numbers denote similar structures, features, or elements.

DETAILED DESCRIPTION

Figure 1:
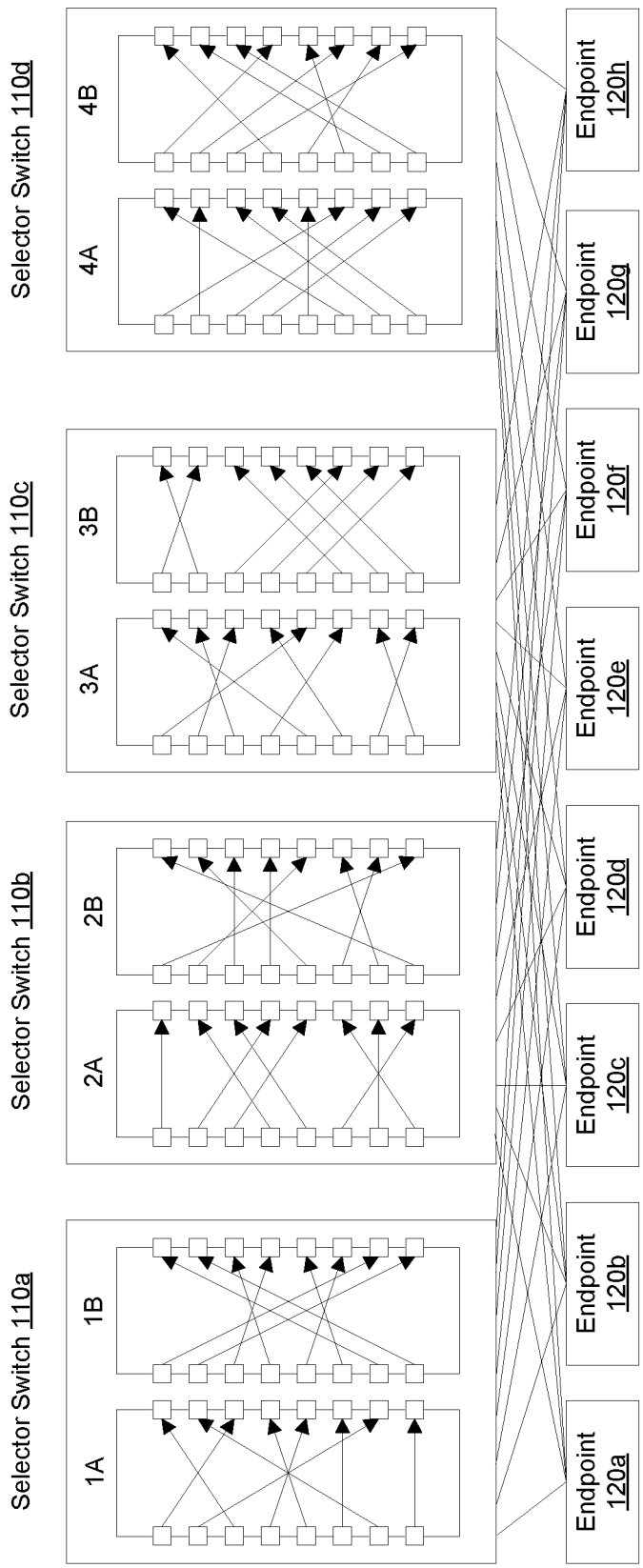
FIG. 1 depicts a block diagram illustrating an example of a computing network, in accordance with some example embodiments.

A conventional computing network may rely on fully configurable crossbar switches to achieve a fully interconnected network topology. However, the hardware cost of constructing a fully interconnected computing network using crossbar switches may be prohibitive. In some example embodiments, the hardware cost associated with a fully interconnected computing network may be reduced by implementing the computing network using partially configurable selector switches. Nevertheless, a direct path (e.g., one-hop) path between two endpoints in the computing network may not always be available if the computing network is implemented using partially configurable selector switches. For instance, traffic from a first endpoint to a second endpoint may need to be buffered at the first endpoint until the topology of the computing network is reconfigured to provide a direct path between the first endpoint and the second endpoint. The resulting latency may prevent the computing network from adequately serving latency-sensitive traffic between the first endpoint and the second endpoint.

In some example embodiments, the latency in a computing network implemented using partially configurable selector switches may be reduced by at least offsetting the reconfigurations of the selector switches such that, at any point in time, only some but not all of the selector switches in the computing network undergo reconfiguration. Accordingly, a path (e.g., a direct path or an indirect path) may exist between every endpoint within the computing network at any point in time to ensure that latency-sensitive traffic may traverse the computing network without excessive delay.

The use of indirect paths to send traffic may reduce the overall capacity of the computing network by imposing a bandwidth tax on at least some of the traffic traversing through the computing network. For example, a conventional crossbar switch may provide a direct path between every endpoint coupled through the crossbar switch whereas a selector switch may provide only an indirect (e.g., multi-hop) path between some of the endpoints coupled through the selector switch. Routing traffic through an indirect path may reduce the overall capacity of the computing network because traffic routed through an indirect path may consume more bandwidth than traffic routed through a direct path. As such, in some example embodiments, the capacity of a computing network implemented using selector switches may be maximized by at least routing traffic between the endpoints of the computing network based one or more criteria including, for example, the latency sensitivity of the traffic, the volume (e.g. in bytes) of the traffic, the current traffic conditions in the computing network, the computer program generating the traffic, and/or the like.

In some example embodiments, a selector switch may be configured to switch between a subset of interconnection patterns that includes some but not all of the possible interconnection patterns between the input ports and output ports of the selector switch. Moreover, each interconnection pattern may interconnect some but not all of the input ports and the output ports in the selector switch. The current topology of the computing network may be determined based on the interconnection pattern at each of the selector switches included in the network. For instance, the current topology of the computing network may include a direct path for traffic between two endpoints coupled via the interconnection pattern at a single selector switch. Alternatively and/or additionally, the current topology of the computing network may include an indirect path for traffic between two endpoints coupled via the interconnection pattern at multiple selector switches. Accordingly, some types traffic, such as high volume and latency tolerant bulk traffic that may constitute the majority of the computing network's overall traffic, may be routed through direct paths. Because a direct path may not be currently available given the current topology of the computing network, some traffic may be buffered until the computing network is reconfigured to provide the requisite direct path. Meanwhile, other types of traffic, such as low volume and low-latency traffic, may be routed through any currently available path including indirect paths that require the low-latency traffic to traverse through one or more intermediary selector switches and endpoints. Whether traffic is routed using a direct path or an indirect path may be determined based on one or more criteria including, for example, the latency sensitivity of the traffic, the volume (e.g. in bytes) of the traffic, the current traffic conditions in the computing network, the computer program generating the traffic, and/or the like.

In some example embodiments, the topology of the computing network may be configured to satisfy the properties of an expander-graph network topology. For example, the topology of the computing network may be configured to ensure that at least one path exist, at all times, between every endpoint in the computing network. That is, every reconfiguration of the topology of the computing network may be required to include a direct path or an indirect path between every pair of endpoints in the computing network. Thus, where the current topology of the computing network does not provide a direct path between two endpoints, then the current topology of the computing network may be required to include at least one indirect path between these two endpoints. Alternatively and/or additionally, the topology of the computing network may be configured to ensure at least one direct path exist, at some point in time, between any two endpoints in the computing network. For instance, at least one reconfiguration of the topology of the computing network may be required to include a direct path between every pair of endpoints in the computing network. As such, if a direct path between two endpoints is not available as part of the current topology of the computing network, then the subsequent topology of the computing network may be required to include a direct path between the two endpoints.

As noted, the topology of the computing network may undergo a reconfiguration when the selector switches in the computing network switch from one interconnection pattern to another interconnection pattern. In some example embodiments, in order to support low-latency traffic, the topology of the computing network may undergo an offset reconfiguration in which some but not all of the selector switches in the computing network switch from one interconnection pattern to another interconnection pattern. The offset reconfiguration of the computing network may preserve at least some of the paths between the endpoints of the computing network. These paths may be especially necessary for carrying low-latency traffic that cannot be delayed until the computing network is able to complete its reconfiguration. By contrast, the entire computing network may be disrupted if the topology of the computing network undergoes a simultaneous reconfiguration in which every selector switch in the computing network switch from one interconnection pattern to another interconnection pattern at the same time. The absence of any available path while the topology of the computing network undergoes simultaneous reconfiguration may impose excessive delays on low-latency traffic.

FIG. 1 depicts a block diagram illustrating an example of a computing network 100, in accordance with some example embodiments. Referring to FIG. 1, the computing network 100 may include a plurality of selector switches including, for example, a first selector switch 110a, a second selector switch 110b, a third selector switch 110c, a fourth selector switch 110d, and/or the like. As shown in FIG. 1, the first selector switch 110a, the second selector switch 110b, the third selector switch 110c, and the fourth selector switch 110d may interconnect a plurality of endpoints including, for example, a first endpoint 120a, a second endpoint 120b, a third endpoint 120c, a fourth endpoint 120d, a fifth endpoint 120e, a sixth endpoint 120f, a seventh endpoint 120g, and an eighth endpoint 120h. As used herein, an endpoint may refer to a physical and/or logical grouping of any number of computing nodes. For instance, an endpoint may include a top-of-rack (TOR) switch coupled with multiple computing nodes.

In some example embodiments, the computing network 100 may be a reconfigurable computing network whose topology may be reconfigured by the first selector switch 110a, the second selector switch 110b, the third selector switch 110c, and/or the fourth selector switch 110d switching between different interconnection patterns. For instance, FIG. 1 shows that the first selector switch 110a may switch between interconnection patterns 1A and 1B, the second selector switch 110b may switch between interconnection patterns 2A and 2B, the third selector switch 110c may switch between interconnection patterns 3A and 3B, and the fourth selector switch 110d may switch between the interconnection patterns 4A and 4B.

The current topology of the computing network 110 may be determined based on the interconnection pattern at each of the first selector switch 110a, the second selector switch 110b, the third selector switch 110c, and the fourth selector switch 110d. For example, the current topology of the computing network 110 may include direct paths and/or indirect paths between the first endpoint 120a, the second endpoint 120b, the third endpoint 120c, the fourth endpoint 120d, the fifth endpoint 120e, the sixth endpoint 120f, the seventh endpoint 120g, and the eighth endpoint 120h. A direct path between two endpoints may be formed by the interconnection pattern at a single selector switch. Traffic routed through a direct path may therefore traverse only a single selector switch. By contrast, an indirect path between two endpoints may be formed by the interconnection patterns at multiple selector switches. Accordingly, traffic routed through an indirect path may be required to traverse one or more intermediary selector switches as well as endpoints.

Figure 2A:
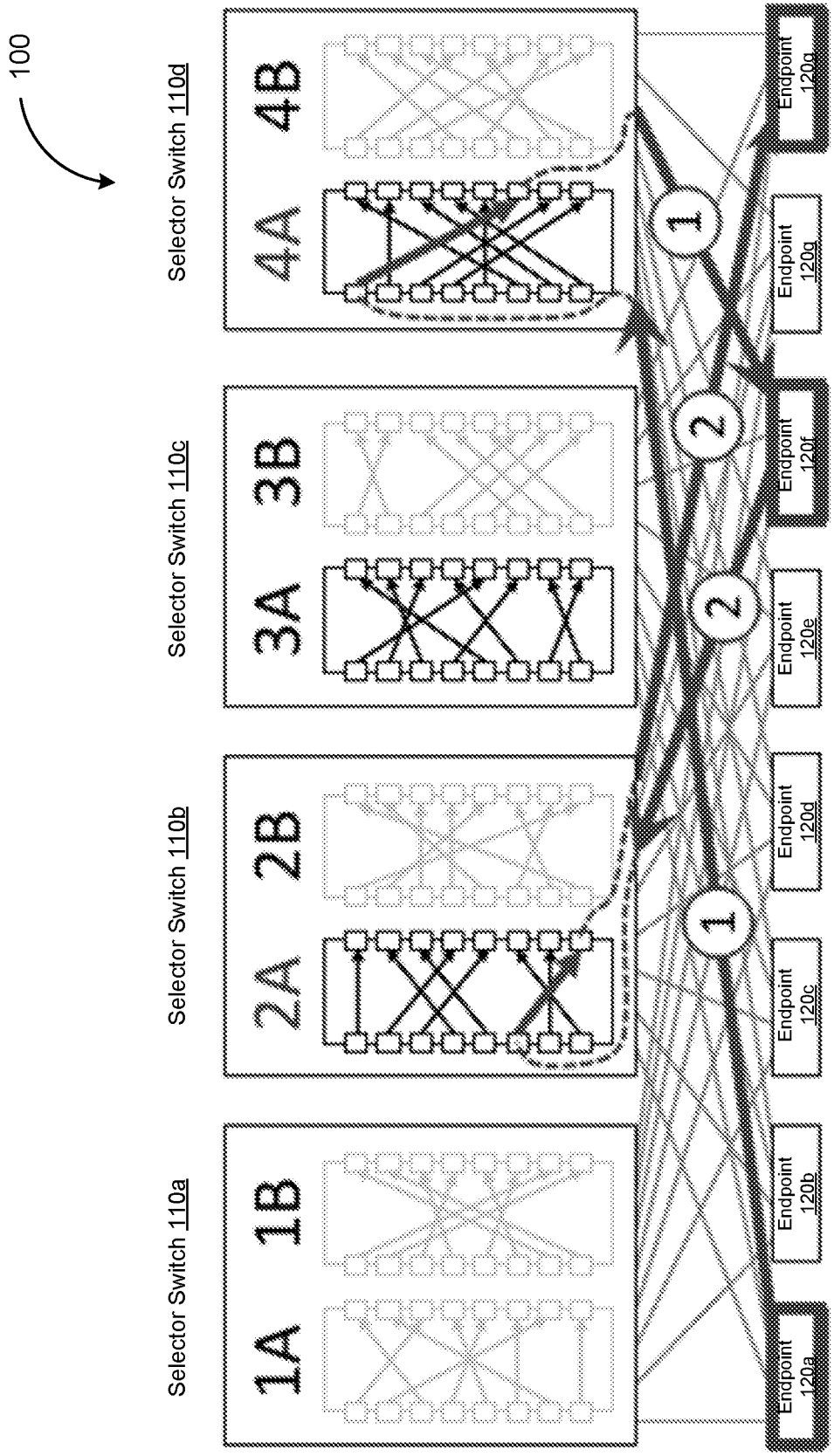
FIG. 2A depicts a block diagram illustrating an example of an indirect path in a reconfigurable network, in accordance with some example embodiments.

To further illustrate, FIG. 2A depicts an example of an indirect path, in accordance with some example embodiments. Referring to FIGS. 1 and 2A, the indirect path may exist between the first endpoint 120a and the eighth endpoint 120h. As shown in FIG. 2A, the indirect path may be formed by the interconnection pattern 4A at the fourth selector switch 110d, which may provide a first path denoted as "1" in FIG. 2A that interconnects the first endpoint 120a with the sixth endpoint 120f. Furthermore, the indirect path may be formed by the interconnection pattern 2A at the second selector switch 110b, which may provide a second path denoted as "2" in FIG. 2A that interconnects the sixth endpoint 120f with the eighth endpoint 110h. Accordingly, using the indirect path, traffic from the first endpoint 120a to the eighth endpoint 120h may be routed first to the sixth endpoint 110 via the fourth selector switch 110d before being routed from the sixth endpoint 120f to the eighth endpoint 120h via the second selector switch 110b.

Figure 2B:
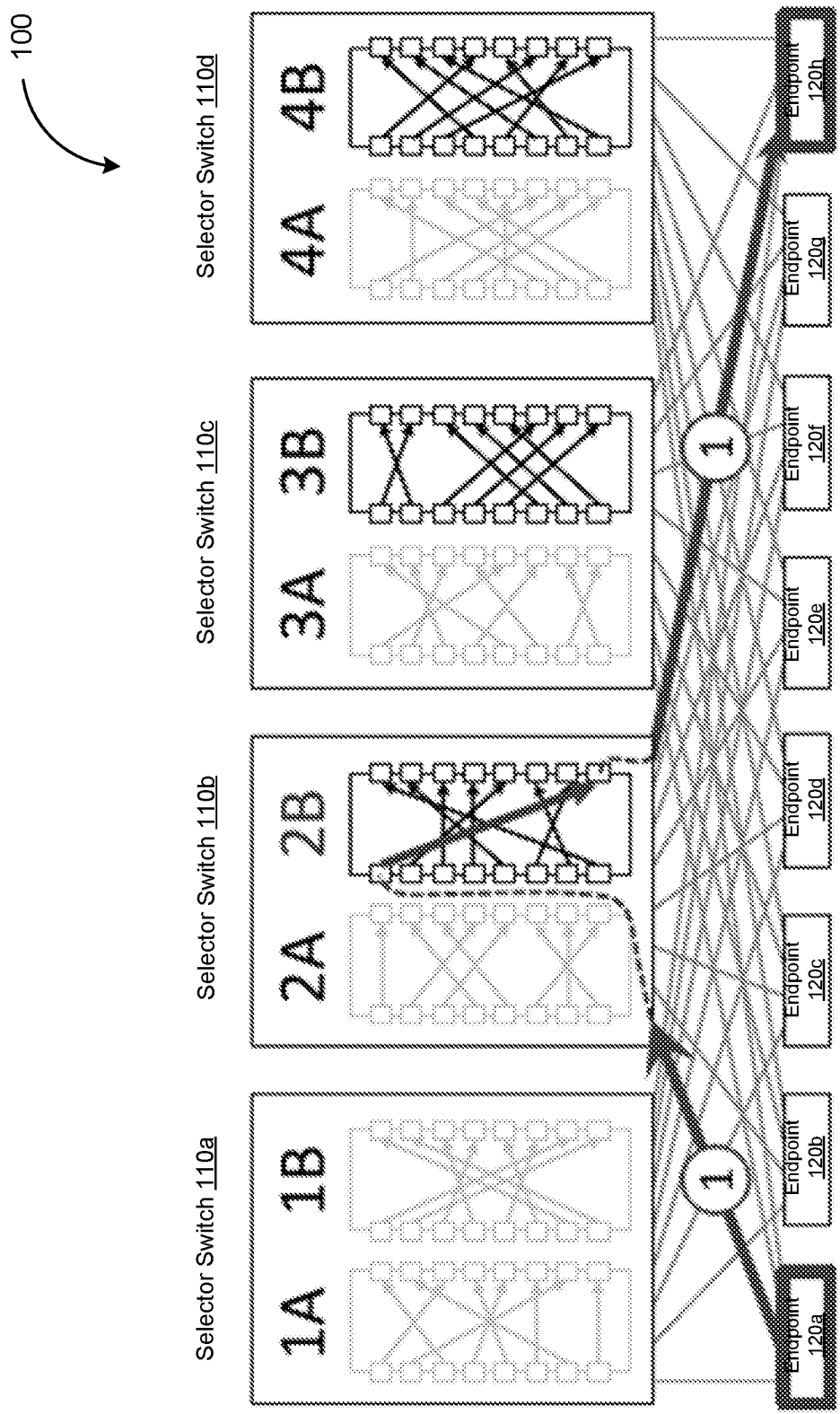
FIG. 2B depicts a block diagram illustrating an example of a direct path in a reconfigurable network, in accordance with some example embodiments.

FIG. 2B depicts an example of a direct path, in accordance with some example embodiments. As shown in FIG. 2B, the direct path may exist between the first endpoint 120a and the eighth endpoint 120h. Moreover, the direct path may be formed by the interconnection pattern 2B at the second selector switch 110b, which may provide a single path denoted as "1" in FIG. 2B that directly interconnects the first endpoint 120a and the eighth endpoint 120h. Using the direct path, traffic may be routed directly from the first endpoint 120a to the eighth endpoint 120h through the second selector switch 120b without traversing any intermediary selector switches and/or endpoints.

Using the indirect path instead of the direct path to route traffic from the first endpoint 110a to the eighth endpoint 110*h* may incur a bandwidth tax. For example, using the direct path to send an x quantity of bytes from the first endpoint 120*a* to the eighth endpoint 120*h* may consume only x bytes of the capacity of the computing network 110. By contrast, using the indirect path 200 to send x quantity of bytes from the first endpoint 120*a* to the eighth endpoint 120*h* may consume (k·x) bytes of network capacity, wherein k may correspond to a quantity of hops in the indirect path. Accordingly, using the indirect path instead of the direct path to send the same x quantity of bytes from the first endpoint 120*a* to the eighth endpoint 120*h* may incur a (k−1)x quantity of bandwidth tax. This bandwidth tax may diminish the overall capacity of the computing network 100.

As noted, the computing network 100 may be a reconfigurable network whose topology may be reconfigured by the first selector switch 110*a*, the second selector switch 110*b*, the third selector switch 110*c*, and/or the fourth selector switch 110*d* switching between different interconnection patterns. That is, according to some example embodiments, the computing network 100 may transition between different topologies as the first selector switch 110*a*, the second selector switch 110*b*, the third selector switch 110*c*, and/or the fourth selector switch 110*d* switch between different interconnection patterns. Referring again to FIGS. 2A-B, the indirect path 200 may be part of a first topology of the computing network 100 at a first time $t_1$ when the second selector switch 110*b* is switched to the interconnection pattern 2A and the fourth selector switch 110*d* is switched to the interconnection pattern 4A. By contrast, the direct path may be part of a second topology of the computing network 100 at a second time $t_2$ when the second selector switch 110*b* is switched to the interconnection pattern 2B.

In some example embodiments, in order to maximize the capacity of the computing network 100, the routing of traffic in the computing network 110 may be performed based on the latency sensitivity and/or the size of the traffic. For example, referring again to FIGS. 2A-B, the indirect path may be used for routing only low-latency traffic between the first endpoint 120*a* and the eighth endpoint 120*h*. By contrast, latency tolerant bulk traffic between the first endpoint 120*a* and the eighth endpoint 120*h* may be routed using the direct path. As used herein, bulk traffic may refer to traffic exceeding a size threshold (e.g., 15 MB and/or the like). Such bulk traffic may constitute the majority of the overall traffic of the computing network 100. As such, using the direct path to route latency tolerant bulk traffic between the first endpoint 120*a* and the eighth endpoint 120*h* may maximize the overall capacity of the computing network 100 by at least minimizing the bandwidth tax associated the transfer of data between the first endpoint 120*a* and the eighth endpoint 120*h*.

The direct path may not be currently available for routing bulk traffic from the first endpoint 120*a* to the eighth endpoint 120*h*. As such, in some example embodiments, bulk traffic may be buffered at the first endpoint 120*a* until the topology of the computing network 100 is reconfigured to include the direct path. For example, at the first time $t_1$ when the current topology of the computing network 100 does not include the direct path, data packets forming bulk traffic from the first endpoint 120*a* to the eighth endpoint 120*h* may be buffered at the first endpoint 120*a* until the second time $t_2$ when the computing network 100 transitions to a different topology that includes the direct path. By contrast, low-latency traffic may be sent currently to the eighth endpoint 120*h* using any currently available path. Accordingly, data packets forming low-latency traffic may be sent using whichever one of the indirect path or the direct path is available at the time.

In some example embodiments, the topology of the computing network 100 may be configured to ensure that at least one path exist, at all times, between every pair of endpoints in the computing network 100. For example, the topology of the computing network 100 may be configured such that the interconnection patterns at the first selector switch 110*a*, the second selector switch 110*b*, the third selector switch 110*c*, and/or the fourth selector switch 110*d* either directly and/or indirectly interconnect the first endpoint 120*a* and the eighth endpoint 120*h*. Accordingly, the topology of the computing network 100 at the first time $t_1$ may be required to include the indirect path between the first endpoint 120*a* and the eighth endpoint 120*h* because the direct path between the first endpoint 120*a* and the eighth endpoint 120*h* is not part of that topology.

Alternatively and/or additionally, the topology of the computing network 100 may be configured to ensure at least one direct path exist, at some point in time, between every pair of endpoints in the computing network 100. For instance, the topology of the computing network 110 may be configured such As such, while though the direct path 250 between the first endpoint 120*a* and the eighth endpoint 120*h* may not be part of the topology of the computing network 110 at the first time $t_1$, the direct path 250 may nevertheless be part of the topology of the computing network 100 at the second time $t_2$ after the topology of the computing network 100 undergoes a reconfiguration in which at least the second switch 110*b* switched from the interconnection pattern 2A to the interconnection pattern 2B.

In some example embodiments, the topology of the computing network 100 may be generated randomly or deterministically to satisfy the properties of an expander-graph network topology. For instance, the topology of the computing network 100 may be generated randomly or deterministically to ensure that at least one path always exist between every pair of endpoints in the computing network 100. Furthermore, the topology of the computing network 100 may be generated randomly or deterministically to ensure at least one direct path exist, at some point in time, between every pair of endpoints in the computing network 100. Although the topology of the computing network 100 may always include a direct path between at least some of the pairs of endpoints in the computing network 100, it should be appreciated that a direct path between two endpoints may be rendered unavailable due to a failure, for example, at one or more of the first selector switch 110*a*, the second selector switch 110*b*, the third selector switch 110*c*, and the fourth selector switch 110*d*. In the event that a direct path becomes unavailable, an indirect path may be used to convey traffic between the two endpoints including, for example, the high volume and latency tolerant bulk traffic that would have otherwise being conveyed via the direct path.

In some example embodiments, the topology of the computing network 100 may be generated randomly by at least factoring a complete graph (e.g., an N×N all-ones matrix) into an N quantity of disjoint and symmetric interconnection patterns (e.g. permutation matrices and/or the like). To reduce the computational cost of this factorization when the computing network 100 is large, graph lifting may be performed to generate large factorization from smaller ones. The N quantity of disjoint and symmetric interconnection patterns may be assigned to a u quantity of selector switches (e.g., the first selector switch 110*a*, the second selector switch 110b, the third selector switch 110c, and the fourth selector switch 110d) in the computing network 100 such that each selector switch in the computing network 100 is assigned an N/u quantity of interconnection patterns. Moreover, the order in which each of the u quantity of selector switches in the computing network 100 cycles through the corresponding N/u quantity of interconnection patterns may be random.

It should be appreciated that a randomly generated topology may fail to satisfy the properties of an expander-graph network topology. For example, the randomly generated topology may fail to provide, at all times, at least one path between every pair of endpoints in the computing network 100. Alternatively and/or additionally, the randomly generated topology may fail to provide, at some point in time, at least one direct path between every pair of endpoints in the computing network 100. In these scenarios, one or more additional topologies may be generated the computing network 100 until a topology that satisfies the properties of an expander-graph network topology is found.

As noted, the topology of the computing network 100 may undergo a reconfiguration when the first selector switch 110a, the second selector switch 110b, the third selector switch 110c, and/or the fourth selector switch 110d switch from one interconnection pattern to another interconnection pattern. In some example embodiments, in order to support low-latency traffic, the topology of the computing network 100 may undergo an offset reconfiguration in which some but not all of the selector switches in the computing network 100 switch from one interconnection pattern to another interconnection pattern at a time. For example, when the computing network 100 is configured to perform an offset reconfiguration, at least one selector switch in the computing network 100 may switch interconnection patterns at the first time $t_1$ while at least one other selector switch in the computing network 100 may switch interconnection patterns at the second time $t_2$.

The offset reconfiguration of the computing network 100 may preserve at least some of the paths in the computing network 100 for carrying low-latency traffic that cannot be delayed until the computing network 100 completes its reconfiguration. By contrast, if the topology of the computing network 100 undergoes a simultaneous reconfiguration in which every selector switch in the computing network 100 switch from one interconnection pattern to another interconnection pattern at the same time, then no path in the computing network 100 may be available during the reconfiguration of the computing network 100. The absence of any available path during the reconfiguration of the computing network 100 may impose excessive delays on low-latency traffic.

Figure 3A:
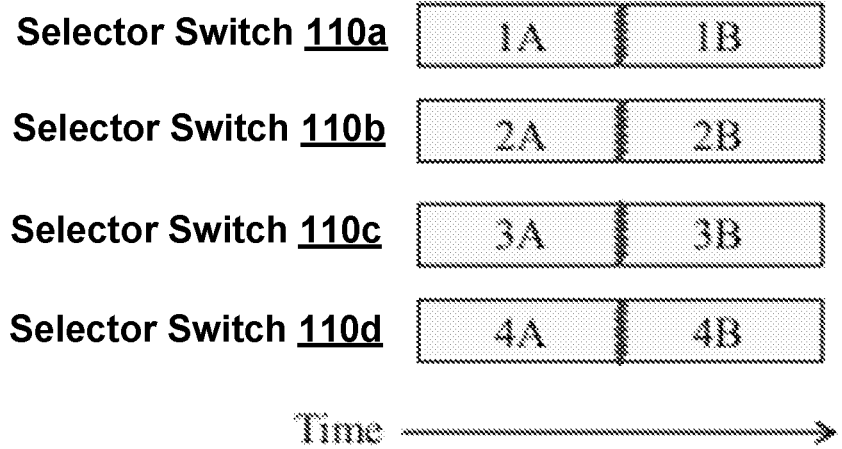
FIG. 3A illustrates a simultaneous reconfiguration of a network topology, in accordance with some example embodiments.
Figure 3B:
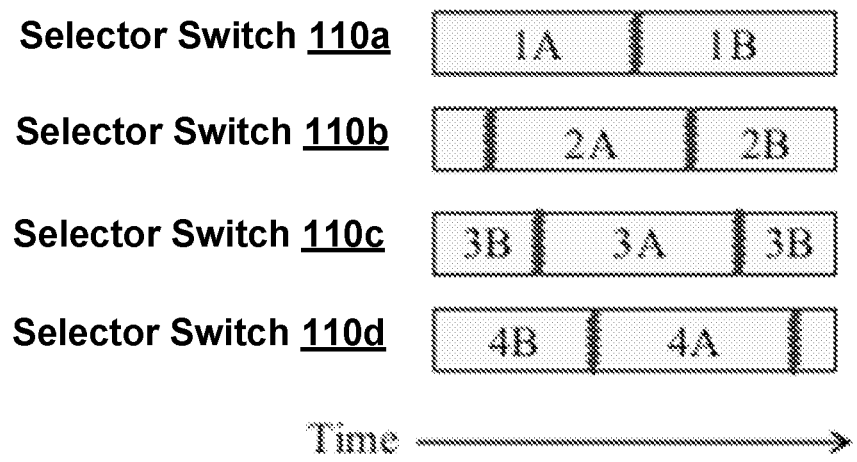
FIG. 3B illustrates an offset reconfiguration of a network topology, in accordance with some example embodiments.

To further illustrate, FIG. 3A illustrates a simultaneous reconfiguration of the topology of the computing network 100, in accordance with some example embodiments. Referring to FIGS. 1, 2A-B, and 3A, when the computing network 100 is configured to undergo a simultaneously reconfiguration, the first selector switch 110a, the second selector switch 110b, the third selector switch 110c, and the fourth selector switch 110d may all switch interconnection patterns at the same time. Meanwhile, FIG. 3B illustrates an offset reconfiguration of the topology of the computing network 100, in accordance with some example embodiments. When the computing network 100 undergoes an offset reconfiguration, one or more of the first selector switch 110a, the second selector switch 110b, the third selector switch 110c, and the fourth selector switch 110d may switch interconnection patterns at different times. In the example shown in FIG. 3B, the switching of the interconnection patterns may be fully staggered such that the first selector switch 110a, the second selector switch 110b, the third selector switch 110c, and the fourth selector switch 110d may all switch interconnection patterns at different times.

As noted, a simultaneous reconfiguration of the computing network 100 may disrupt every available path in the computing network 100. In particular, when the simultaneous reconfiguration of the computing network 100 takes places, any data packet that is still in transit through the computing network 100 may become caught in a loop and/or redirected along a less optimal path. As such, a simultaneous reconfiguration of the computing network 100 may impose significant delays on the delivery of at least some of the traffic traversing the computing network 100. To minimize such delays on traffic through the computing network 100, the computing network 100 may undergo an offset reconfiguration instead of a simultaneous reconfiguration. Furthermore, according to some example embodiments, each reconfiguration of the computing network 100 may be spaced at least an ε+r quantity of time apart, wherein ε may denote the maximum end-to-end delay of traffic traversing the computing network 100 and r may denote the delay associated with the reconfiguration of the computing network 100. It should be appreciated that the value of ε may depend on a number of factors including, for example, the maximum path lengths (e.g., quantity of hops) between endpoints, the maximum depth of the queues at the endpoints, maximum link rate, maximum propagation delay, and/or the like. Nevertheless, spacing the reconfiguration of the computing network 100 at least an ε+r quantity of time apart may ensure that the data packets traversing the computing network 100 may have at least an ε quantity of time to reach its destination in the computing network 100.

Figure 3C:
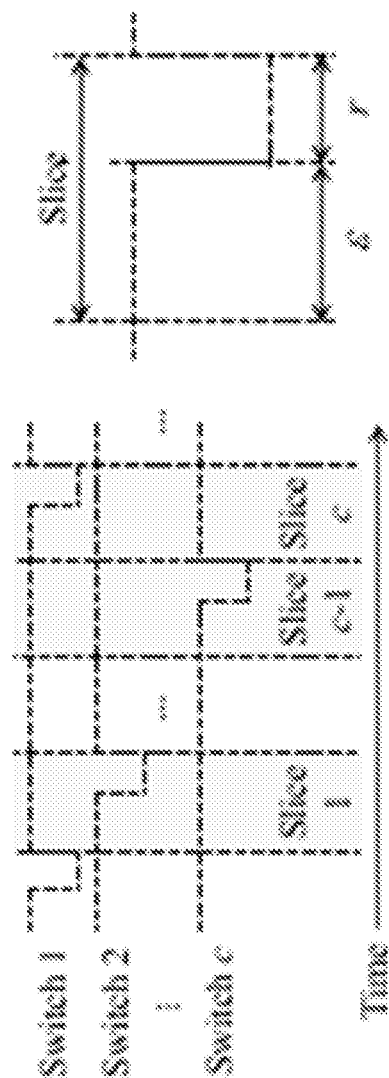
FIG. 3C illustrates a graph illustrating an offset reconfiguration of a network topology, in accordance with some example embodiments.

To further illustrate, FIG. 3C illustrating an offset reconfiguration of a network topology, in accordance with some example embodiments. Referring to FIG. 3C, each of a c quantity of selector switches in the computing network 100 may switch at a different time to form a series of topology slices (1, . . . , c−1, c). Each one of these c quantity of topology slices may be associated with the time constant ε corresponding to the maximum end-to-end delay for traversing the computing network 100 and the time constant r corresponding to the reconfiguration delay of the computing network 100. Accordingly, each of these c quantity of topology slices may have a duration of ε+r, which may ensure that a data packet traversing the computing network 100 may have at least an ε quantity of time to reach its destination in the computing network 100.

Figure 4A:
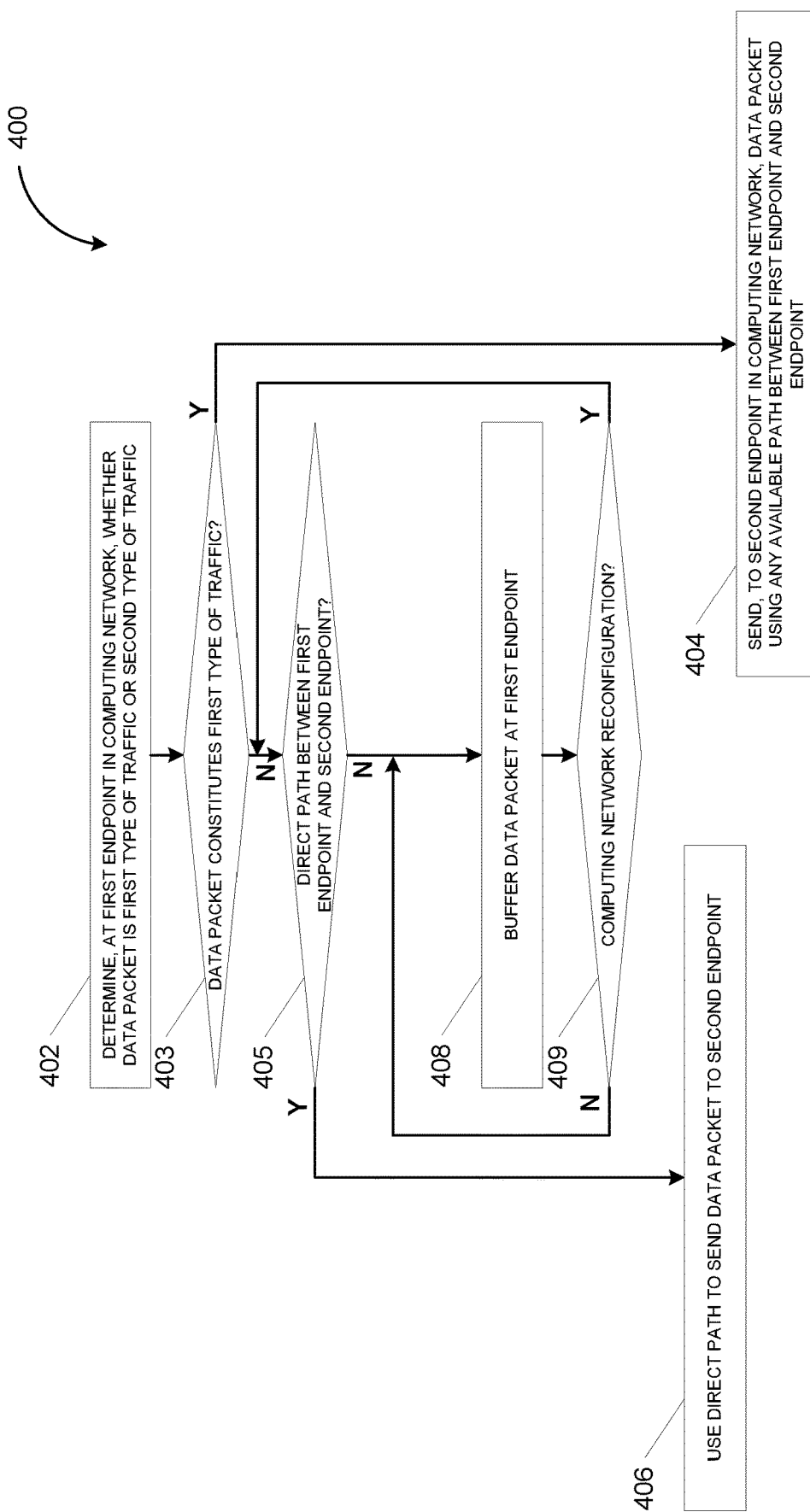
FIG. 4A depicts a flowchart illustrating a process for routing traffic through a reconfigurable network, in accordance with some example embodiments.

FIG. 4A depicts a flowchart illustrating a process 400 for routing traffic through a reconfigurable network, in accordance with some example embodiments. Referring to FIGS. 1, 2A-B, and 4A, the process 400 may be performed at a first endpoint in the computing network 100 in order to send a data packet to a second endpoint in the computing network 100.

At 402, a first endpoint in the computing network 100 may determine whether a data packet constitutes a first type of traffic or a second type of traffic. For example, the first endpoint 120a in the computing network 100 may send a data packet to the eighth endpoint 120h in the computing network 100. In some example embodiments, traffic in the computing network 100 may be routed based on the latency sensitivity, the volume of the traffic, the current traffic conditions in the computing network, the computer program generating the traffic, and/or the like. For example, the first endpoint 120a may determine whether the data packet constitutes high volume and latency-tolerant bulk traffic or low volume and low-latency traffic. High volume bulk traffic may refer to traffic exceeding a size threshold (e.g., 15 MB and/or the like) whereas low-latency traffic may refer to traffic below the size threshold. Alternatively and/or additionally, latency tolerant traffic may refer to traffic that may tolerate an above threshold latency (e.g., 10 milliseconds) while low-latency traffic may refer to traffic that cannot tolerate latency above the threshold.

At 403-Y, the first endpoint may determine that the data packet constitutes a first type of traffic. As such, at 404, the first endpoint may send, to a second endpoint in the computing network 100, the data packet using any available path between the first endpoint and the second endpoint. For example, if the first endpoint 120a determines that the data packet constitutes low volume and low-latency traffic (e.g., traffic below a size threshold and latency threshold), the first endpoint 120a may use any path that is immediately available given the current topology of the computing network 100 to send the data packet to the eighth endpoint 120h. In particular, the first endpoint 120a may use the indirect path instead of the direct path if the indirect path is currently available given the current topology of the computing network 100.

Alternatively, at 403-N, the first endpoint may determine that the data packet constitutes a second type of traffic. Accordingly, at 405, the first endpoint may determine whether a current topology of the computing network 100 includes a direct path between the first endpoint and the second endpoint. In some example embodiments, to maximize the capacity of the computing network 100, the first endpoint 120a may be configured to use only a direct path to send high volume and latency tolerant bulk traffic (e.g., traffic exceeding a size threshold and latency threshold) to the eighth endpoint 120h. As such, when the first endpoint 120a determines that the data packet constitutes high volume and latency tolerant bulk traffic, the first endpoint 120a may further determine whether the current topology of the computing network 100 includes the direct path for sending the data packet to the eighth endpoint 120h.

At 405-Y, the first endpoint may determine that the current topology of the computing network 100 includes a direct path between the first endpoint and the second endpoint. As such, at 406, the first endpoint may use the direct path to send, to the second endpoint, the data packet. For example, if the first endpoint 120a determines that the direct path is available given the current topology of the computing network 100, the first endpoint 120a may use the direct path to send, to the eighth endpoint 120h, the data packet.

Alternatively, at 405-N, the first endpoint may determine that the current topology of the computing network 100 does not include a direct path between the first endpoint and the second endpoint. Accordingly, the 408, the first endpoint may buffer the data packet. In some example embodiments, the first endpoint 120a may be configured to wait until the direct path becomes available to send the data packet to the eighth endpoint 120h. In the meantime, the data packet may be buffered at the first endpoint 120a.

At 409, the first endpoint may determine whether the computing network 100 has undergone a reconfiguration. In some example embodiments, the computing network 100 may be a reconfigurable network whose topology may be reconfigured by the first selector switch 110a, the second selector switch 110b, the third selector switch 110c, and/or the fourth selector switch 110d switching between different interconnection patterns. As such, the first endpoint 120a may be configured to determine when the computing network 100 has undergone a reconfiguration such that the current topology of the computing network 100 may include the direct path between the first endpoint 120a and the eighth endpoint 120h.

At 409-Y, the first endpoint may determine that the computing network 100 has undergone a reconfiguration. As such, the process 400 may resume at operation 405 and the first endpoint may again determine whether the current topology of the computing network includes a direct path between the first endpoint and the second endpoint. Alternatively, at 409-N, the first endpoint may determine that the computing network 100 has not undergone a reconfiguration. Accordingly, the process 400 may resume at operation 408 and the first endpoint may continue to buffer the data packet. For instance, when the first endpoint 120a detects that the computing network 100 has undergone a reconfiguration, the first endpoint 120a may again determine whether the current configuration of the computing network 100 includes the direct path between the first endpoint 120a and the eighth endpoint 120h. As noted, the first endpoint 120a may be required to use the direct path to send the data packet to the eighth endpoint 120h. Accordingly, if the current topology of the computing network 100 includes the direct path upon reconfiguration, the first endpoint 120a may use the direct path to send the data packet to the eighth endpoint 120h. By contrast, if the current topology of the computing network 100 still excludes the direct path after the reconfiguration, the first endpoint 120a may continue to buffer the data packet until the computing network 100 transitions to a topology that includes the direct path between the first endpoint 120a and the eighth endpoint 120h.

Figure 4B:
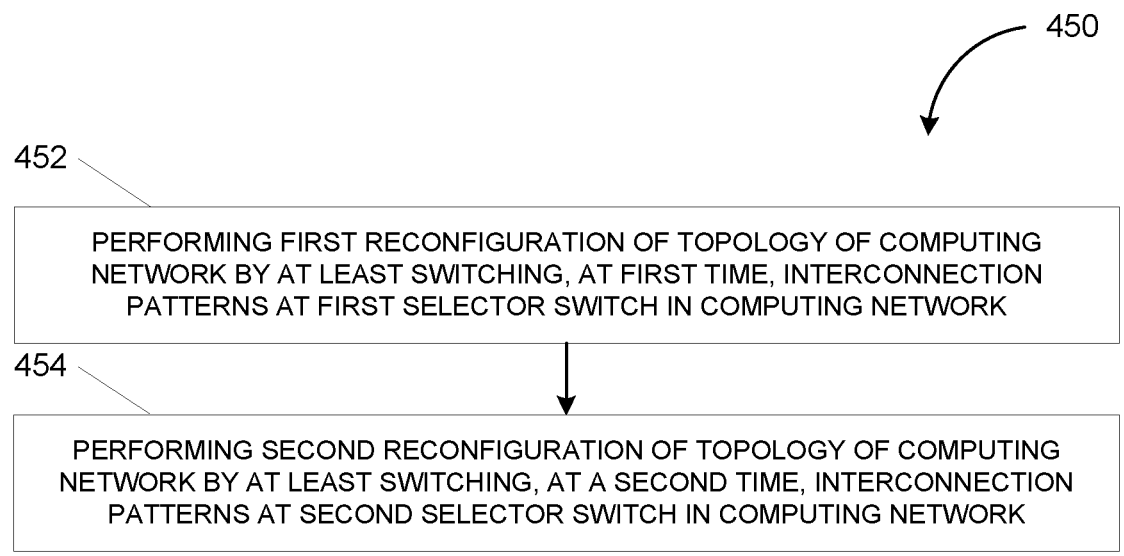
FIG. 4B depicts a flowchart illustrating a process for reconfiguring a network, in accordance with some example embodiments.

FIG. 4B depicts a flowchart illustrating a process 450 for reconfiguring a network, in accordance with some example embodiments. Referring to FIGS. 1, 2A-B, 3A-C, and 4B, the process 450 may be performed by the computing network 100 in order to reconfigure the current topology of the computing network 100.

At 452, a first reconfiguration of the topology of the computing network 100 may be performed by switching, at a first time, the interconnection patterns at a first selector switch in the computing network 100. For example, as shown in FIG. 3B, the first selector switch 110a may be configured to switch from the interconnection pattern 1A to the interconnection pattern 1B at the first time $t_1$. The first selector switch 110a switching from the interconnection pattern 1A to the interconnection pattern 1B may result in a reconfiguration of the topology of the computing network 100.

At 404, a second reconfiguration of the topology of the computing network 100 may be performed by switching, at a second time, interconnection patterns at a second selector switch in the computing network 100. In some example embodiments, the computing network 100 may be configured to undergo an offset reconfiguration in which one or more of the first selector switch 110a, the second selector switch 110b, the third selector switch 110c, and the fourth selector switch 110d switches interconnection patterns at different times. As such, because the first selector switch 110a switched interconnection patterns at the first time $t_1$, FIG. 3B shows that the second selector switch 110b may be configured to switch from the interconnection 2A to the interconnection pattern 2B at the second time $t_2$. The first selector switch 110a and the second selector switch 110b may be configured to switch interconnection patterns at different times in order to preserve at least some of the paths between the endpoints of the computing network. By contrast, having the first selector switch 110a, the second selector switch 110b, the third selector switch 110c, and the fourth selector switch 110d switching interconnection patterns all at the same time may disrupt the entire computing network 100.

According to some example embodiments, the reconfiguration of the computing network 100 may be spaced at least an ε+r quantity of time apart. For example, the first time $t_1$ for switching of the interconnection pattern at the first selector switch 110a and the second time $t_2$ for switching the interconnection pattern at the second selector switch 110b may be spaced at least an ε+r quantity of time apart. As such, after the first selector switch 110a switches from the interconnection pattern 1A to the interconnection pattern 1B, the second selector switch 110b may not switch interconnection patterns until at least an ε+r quantity of time has elapsed. Spacing the reconfiguration of the computing network an ε+r quantity of time apart may ensure that a data packet traversing the computing network 100 may have at least an ε quantity of time to reach its destination in the computing network 100. By contrast, the data packet may become caught in a loop and/or redirected along a less optimal path if the computing network 100 undergoes a reconfiguration before the data packet is able to reach its destination, thereby imposing significant delays upon the delivery of the data packet.

Figure 5:
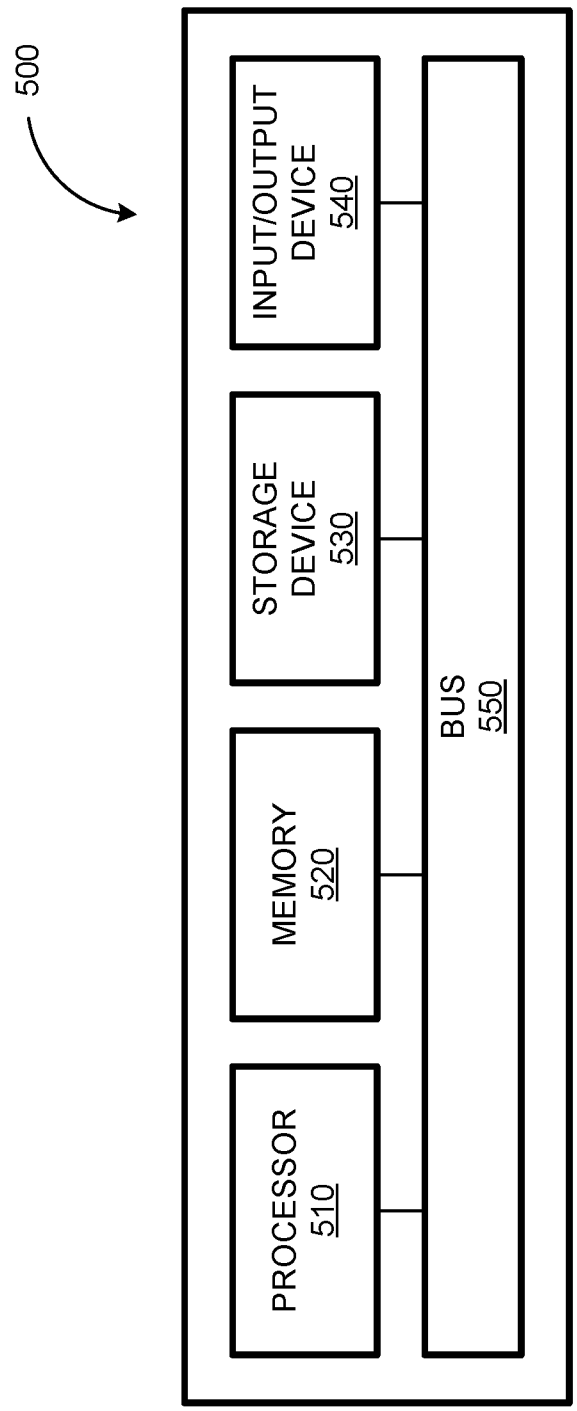
FIG. 5 depicts a block diagram illustrating a computing system, in accordance with some example embodiments.

FIG. 5 depicts a block diagram illustrating a computing system 500 consistent with implementations of the current subject matter. In some example embodiments, the computing system 500 may be configured to implement a selector switch, an endpoint, and/or any components therein. Referring to FIGS. 1, 2A-B, and 5, the computing system 500 may implement one or more of the first selector switch 110a, the second selector switch 110b, the third selector switch 110c, and the fourth selector switch 110d. Alternatively and/or additionally, the computing system 500 may implement any one of the first endpoint 120a, the second endpoint 120b, the third endpoint 120c, the fourth endpoint 120d, the fifth endpoint 120e, the sixth endpoint 120f, the seventh endpoint 120g, and the eighth endpoint 120h.

As shown in FIG. 5, the computing system 500 may include a processor 510, a memory 520, a storage device 530, and input/output device 540. The processor 510, the memory 520, the storage device 530, and the input/output device 540 can be interconnected via a system bus 550. The processor 510 is capable of processing instructions for execution within the computing system 500. Such executed instructions can implement one or more components of, for example, a selector switch, an endpoint, and/or the like. In some implementations of the current subject matter, the processor 510 can be a single-threaded processor. Alternately, the processor 510 can be a multi-threaded processor. The processor 510 is capable of processing instructions stored in the memory 520 and/or on the storage device 530 to display graphical information for a user interface provided via the input/output device 540.

The memory 520 is a computer readable medium such as volatile or non-volatile that stores information within the computing system 500. The memory 520 can store data structures representing configuration object databases, for example. The storage device 530 is capable of providing persistent storage for the computing system 500. The storage device 530 can be a floppy disk device, a hard disk device, an optical disk device, a tape device, a solid-state device, and/or any other suitable persistent storage means. The input/output device 540 provides input/output operations for the computing system 500. In some implementations of the current subject matter, the input/output device 540 includes a keyboard and/or pointing device. In various implementations, the input/output device 540 includes a display unit for displaying graphical user interfaces.

According to some implementations of the current subject matter, the input/output device 540 can provide input/output operations for a network device. For example, the input/output device 540 can include Ethernet ports or other networking ports to communicate with one or more wired and/or wireless networks (e.g., a local area network (LAN), a wide area network (WAN), the Internet).

In some implementations of the current subject matter, the computing system 500 can be used to execute various interactive computer software applications that can be used for organization, analysis and/or storage of data in various (e.g., tabular) format (e.g., Microsoft Excel®, and/or any other type of software). Alternatively, the computing system 500 can be used to execute any type of software applications. These applications can be used to perform various functionalities, e.g., planning functionalities (e.g., generating, managing, editing of spreadsheet documents, word processing documents, and/or any other objects, etc.), computing functionalities, communications functionalities, etc. The applications can include various add-in functionalities or can be standalone computing products and/or functionalities. Upon activation within the applications, the functionalities can be used to generate the user interface provided via the input/output device 540. The user interface can be generated and presented to a user by the computing system 500 (e.g., on a computer screen monitor, etc.).

One or more aspects or features of the subject matter described herein can be realized in digital electronic circuitry, integrated circuitry, specially designed application specific integrated circuits (ASICs), field programmable gate arrays (FPGAs) computer hardware, firmware, software, and/or combinations thereof. These various aspects or features can include implementation in one or more computer programs that are executable and/or interpretable on a programmable system including at least one programmable processor, which can be special or general purpose, coupled to receive data and instructions from, and to transmit data and instructions to, a storage system, at least one input device, and at least one output device. The programmable system or computing system may include clients and servers. A client and server are generally remote from each other and typically interact through a communication network. The relationship of client and server arises by virtue of computer programs running on the respective computers and having a client-server relationship to each other.

These computer programs, which can also be referred to as programs, software, software applications, applications, components, or code, include machine instructions for a programmable processor, and can be implemented in a high-level procedural and/or object-oriented programming language, and/or in assembly/machine language. As used herein, the term "machine-readable medium" refers to any computer program product, apparatus and/or device, such as for example magnetic discs, optical disks, memory, and Programmable Logic Devices (PLDs), used to provide machine instructions and/or data to a programmable processor, including a machine-readable medium that receives machine instructions as a machine-readable signal. The term "machine-readable signal" refers to any signal used to provide machine instructions and/or data to a programmable processor. The machine-readable medium can store such machine instructions non-transitorily, such as for example as would a non-transient solid-state memory or a magnetic hard drive or any equivalent storage medium. The machine-readable medium can alternatively, or additionally, store such machine instructions in a transient manner, such as for example, as would a processor cache or other random access memory associated with one or more physical processor cores.

To provide for interaction with a user, one or more aspects or features of the subject matter described herein can be implemented on a computer having a display device, such as for example a cathode ray tube (CRT) or a liquid crystal display (LCD) or a light emitting diode (LED) monitor for displaying information to the user and a keyboard and a pointing device, such as for example a mouse or a trackball, by which the user may provide input to the computer. Other kinds of devices can be used to provide for interaction with a user as well. For example, feedback provided to the user can be any form of sensory feedback, such as for example visual feedback, auditory feedback, or tactile feedback; and input from the user may be received in any form, including, but not limited to, acoustic, speech, or tactile input. Other possible input devices include, but are not limited to, touch screens or other touch-sensitive devices such as single or multi-point resistive or capacitive track pads, voice recognition hardware and software, optical scanners, optical pointers, digital image capture devices and associated interpretation software, and the like.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above. In addition, the logic flows depicted in the accompanying figures and/or described herein do not necessarily require the particular order shown, or sequential order, to achieve desirable results. Other implementations may be within the scope of the following claims.

What is claimed is:

1. A system, comprising:
   at least one data processor; and
   at least one memory storing instructions, which when executed by the at least one data processor, cause operations comprising:
   in response to determining that a data packet comprises a first type of traffic, determining to send the data packet from a first endpoint in the network to a second endpoint in the network using a direct path that interconnects the first endpoint and the second endpoint through a single switch, the network including a plurality of endpoints interconnected by a plurality of switches, and the network having a topology that includes, at any one time, a direct path between at least a portion of the plurality of endpoints in the network;
   in response to a current topology of the network including an indirect path but not the direct path between the first endpoint and the second endpoint, buffering, at the first endpoint, the data packet comprising the first type of traffic until the current topology of the network is reconfigured to include the direct path between the first endpoint and the second endpoint, the topology of the network being reconfigured by a reconfiguration of at least one of the plurality of switches;
   in response to the data packet being classified as a second type of traffic, determining to send the data packet using a currently available path included in the current topology of the network, the currently available path being the indirect path between the first endpoint and the second endpoint if the direct path between the first endpoint and the second endpoint is unavailable, the indirect path interconnecting the first endpoint and the second endpoint through more than one of the plurality of switches such that the data packet is routed through at least a third endpoint in the network before the data packet is delivered to the second endpoint; and
   sending, via the direct path or the currently available path, the data packet from the first endpoint to the second endpoint.

2. The system of claim 1, wherein at least one reconfiguration of the current topology of the network includes the direct path between the first endpoint and the second endpoint.

3. The system of claim 1, wherein every reconfiguration of the current topology of the network includes at least one path between the first endpoint and the second endpoint.

4. The system of claim 1, wherein the data packet is classified as the first type of traffic or the second type of traffic based at least on a computer program generating the data packet.

5. The system of claim 1, wherein the plurality of switches comprise a plurality of crossbar switches, wherein each of the plurality of crossbar switches include a matrix of switching elements, and wherein toggling one or more switching elements forms a dedicated connection between at least one pair of input port and output port in a corresponding crossbar switch.

6. The system of claim 1, wherein the data packet is classified as the first type of traffic or the second type of traffic based at least on a current traffic conditions in the network.

7. The system of claim 1, wherein the plurality of switches comprise a plurality of selector switches configured to switch between different interconnection patterns, and wherein the current topology of the network is determined by an interconnection pattern at each of the plurality of selector switches.

8. The system of claim 7, wherein the current topology of the network is reconfigured by at least a first selector switch switching from a first interconnection pattern to a second interconnection pattern.

9. The system of claim 8, wherein the first interconnection pattern interconnects the first endpoint and the second endpoint indirectly through a third interconnection pattern at a second selector switch, wherein the second interconnection pattern interconnects the first endpoint and the second endpoint directly, and wherein the data packet is buffered at the first endpoint until the first selector switch switches to the second interconnection pattern.

10. The system of claim 8, wherein the first selector switch includes a plurality of input ports and a plurality of output ports, wherein the first selector switch is configured to switch between a subset of interconnection patterns that includes the first interconnection pattern and the second interconnection pattern, and wherein the subset of interconnection patterns include some but not all of a plurality of possible interconnection patterns between the plurality of input ports and the plurality of output ports in the first selector switch.

11. The system of claim 8, wherein the current topology of the network is further reconfigured by a second selector switch switching from a third interconnection pattern to a fourth interconnection pattern, and wherein the first selector switch and the second selector switch are configured to switch interconnection patterns at different times.

12. The system of claim 11, wherein the first selector switch is configured to switch interconnection patterns at least a threshold quantity of time before or after the second selector switch is configured to switch interconnection patterns.

13. The system of claim 12, wherein the threshold quantity of time is determined based at least on a maximum end-to-end delay associated with the network.

14. The system of claim 12, wherein the threshold quantity of time is determined based on a reconfiguration delay associated with the network.

15. The system of claim 1, wherein the first type of traffic comprises traffic exceeding a size threshold, and wherein the second type of traffic comprises traffic not exceeding the size threshold.

16. The system of claim 1, wherein the first type of traffic comprises traffic exceeding a latency threshold, and wherein the second type of traffic comprises traffic not exceeding the latency threshold.

17. A computer-implemented method, comprising:
in response to determining that a data packet comprises a first type of traffic, determining to send the data packet from a first endpoint in the network to a second endpoint in the network using a direct path that interconnects the first endpoint and the second endpoint through a single switch, the network including a plurality of endpoints interconnected by a plurality of switches, and the network having a topology that includes, at any one time, a direct path between at least a portion of the plurality of endpoints in the network;
in response to a current topology of the network including an indirect path but not the direct path between the first endpoint and the second endpoint, buffering, at the first endpoint, the data packet comprising the first type of traffic until the current topology of the network is reconfigured to include the direct path between the first endpoint and the second endpoint, the topology of the network being reconfigured by a reconfiguration of at least one of the plurality of switches;
in response to the data packet being classified as a second type of traffic, determining to send the data packet using a currently available path included in the current topology of the network, the currently available path being the indirect path between the first endpoint and the second endpoint if the direct path between the first endpoint and the second endpoint is unavailable, the indirect path interconnecting the first endpoint and the second endpoint through more than one of the plurality of switches such that the data packet is routed through at least a third endpoint in the network before the data packet is delivered to the second endpoint; and
sending, via the direct path or the currently available path, the data packet from the first endpoint to the second endpoint.

18. A non-transitory computer readable medium storing instructions, which when executed by at least one processor, result in operations comprising:
in response to determining that a data packet comprises a first type of traffic, determining to send the data packet from a first endpoint in the network to a second endpoint in the network using a direct path that interconnects the first endpoint and the second endpoint through a single switch, the network including a plurality of endpoints interconnected by a plurality of switches, and the network having a topology that includes, at any one time, a direct path between at least a portion of the plurality of endpoints in the network;
in response to a current topology of the network including an indirect path but not the direct path between the first endpoint and the second endpoint, buffering, at the first endpoint, the data packet comprising the first type of traffic until the current topology of the network is reconfigured to include the direct path between the first endpoint and the second endpoint, the topology of the network being reconfigured by a reconfiguration of at least one of the plurality of switches;
in response to the data packet being classified as a second type of traffic, determining to send the data packet using a currently available path included in the current topology of the network, the currently available path being the indirect path between the first endpoint and the second endpoint if the direct path between the first endpoint and the second endpoint is unavailable, the indirect path interconnecting the first endpoint and the second endpoint through more than one of the plurality of switches such that the data packet is routed through at least a third endpoint in the network before the data packet is delivered to the second endpoint; and
sending, via the direct path or the currently available path, the data packet from the first endpoint to the second endpoint.

* * * * *